United States Patent
Lee

(10) Patent No.: US 10,186,680 B2
(45) Date of Patent: Jan. 22, 2019

(54) ORGANIC LIGHT EMITTING DISPLAY DEVICE

(71) Applicant: SAMSUNG DISPLAY CO., LTD., Yongin-si, Gyeonggi-do (KR)

(72) Inventor: Wonse Lee, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/700,520

(22) Filed: Sep. 11, 2017

(65) Prior Publication Data

US 2018/0261797 A1     Sep. 13, 2018

(30) Foreign Application Priority Data

Mar. 9, 2017 (KR) .................. 10-2017-0030274

(51) Int. Cl.
*H01L 51/50* (2006.01)
*H01L 51/52* (2006.01)

(52) U.S. Cl.
CPC ...... *H01L 51/5228* (2013.01); *H01L 51/5008* (2013.01); *H01L 51/5044* (2013.01); *H01L 51/5056* (2013.01); *H01L 51/5212* (2013.01)

(58) Field of Classification Search
CPC ............ H01L 51/5228; H01L 51/5008; H01L 51/5056; H01L 51/5044; H01L 51/5212
See application file for complete search history.

(56) References Cited

U.S. PATENT DOCUMENTS

| | | | |
|---|---|---|---|
| 7,663,306 B2 | 2/2010 | Imamura | |
| 2013/0056784 A1 | 3/2013 | Lee et al. | |
| 2014/0354142 A1 | 12/2014 | Jeong et al. | |
| 2016/0204389 A1* | 7/2016 | Nirengi | H01L 51/0023 438/34 |
| 2016/0240810 A1 | 8/2016 | Oh et al. | |
| 2016/0293888 A1* | 10/2016 | Shim | H01L 27/3246 |
| 2016/0351846 A1* | 12/2016 | Kim | H01L 51/5212 |

FOREIGN PATENT DOCUMENTS

| | | |
|---|---|---|
| JP | 2005-149800 A | 6/2005 |
| JP | 2006-201421 A | 8/2006 |
| KR | 10-2008-0049910 A | 6/2008 |
| KR | 10-2013-0025806 A | 3/2013 |
| KR | 10-2014-0141529 A | 12/2014 |

* cited by examiner

Primary Examiner — Donald L Raleigh
(74) Attorney, Agent, or Firm — Lee & Morse P.C.

(57) ABSTRACT

An organic light emitting display device includes a pixel electrode, an auxiliary electrode, a pixel defining layer, a spacer, a light emitting layer, and an opposite electrode. The pixel electrode and auxiliary electrode on a same layer and are separated and electrically isolated from each other. The pixel defining layer is on the pixel and auxiliary electrodes and exposes at least portions of the pixel and auxiliary electrodes. The spacer corresponds to portions of the auxiliary electrode and pixel defining layer and exposes at least a portion of the auxiliary electrode. The light emitting layer is on the pixel electrode. The opposite electrode is on the light emitting layer and the spacer and is in contact with the auxiliary electrode.

20 Claims, 13 Drawing Sheets

ORGANIC LIGHT EMITTING DISPLAY DEVICE

CROSS-REFERENCE TO RELATED APPLICATION

Korean Patent Application No. 10-2017-0030274, filed on Mar. 9, 2017, and entitled, "Organic Light Emitting Display Device," is incorporated by reference herein in its entirety.

BACKGROUND

1. Field

One or more embodiments relate to an organic light emitting display device.

2. Description of the Related Art

An organic light emitting display includes a plurality of pixels equipped with organic light emitting elements. Each organic light emitting element may include an organic layer between a pixel electrode and an opposite electrode. The pixel electrodes may be arranged in the shape of an island shape, and the opposite electrodes are integrally formed in the pixels.

SUMMARY

In accordance with one or more embodiments, an organic light emitting display device includes a pixel electrode and an auxiliary electrode on a same layer, the pixel electrode and the auxiliary electrode separated and electrically isolated from each other; a pixel defining layer on the pixel electrode and the auxiliary electrode, the pixel defining layer exposing at least a portion of the pixel electrode and at least a portion of the auxiliary electrode; a spacer corresponding to portions of the auxiliary electrode and the pixel defining layer, the spacer exposing at least a portion of the auxiliary electrode; a light emitting layer on the pixel electrode; and an opposite electrode on the light emitting layer and spacer, the opposite electrode in contact with the auxiliary electrode.

A contact portion between the opposite electrode and the auxiliary electrode may be surrounded by the spacer in a direction crossing a surface of the auxiliary electrode facing the opposite electrode. The spacer may have a first opening exposing at least a portion of the auxiliary electrode, the first opening overlapping a contact portion between the opposite electrode and the auxiliary electrode.

The pixel defining layer may have a second opening exposing at least a portion of the pixel electrode and a third opening exposing at least a portion of the auxiliary electrode, the third opening overlapping the first opening. The first opening may have a diameter greater than a diameter of the third opening.

The display device may include a first intermediate layer on at least a portion of a top surface of the pixel defining layer, a top surface of the spacer, the pixel electrode, and the auxiliary electrode, wherein the first intermediate layer has a first hole exposing at least a portion of the auxiliary electrode so that the opposite electrode contacts the auxiliary electrode via the first hole. The first hole may expose only a portion of the auxiliary electrode.

The display device may include a second intermediate layer between the first intermediate layer and the opposite electrode, wherein the second intermediate layer has a second hole corresponding to the first hole so that the opposite electrode contacts the auxiliary electrode via the first hole and the second hole. The second hole may have a center which coincides with a center of the first hole. The spacer and the pixel defining layer may include a same material. The pixel electrode and the auxiliary electrode may include a same material.

In accordance with one or more other embodiments, an organic light emitting display device includes an auxiliary electrode; an insulating layer covering the auxiliary electrode and including an auxiliary electrode hole exposing the auxiliary electrode; a pixel electrode on the insulating layer and electrically insulated from the auxiliary electrode; a pixel defining layer on the insulating layer, the pixel defining layer exposing at least a portion of the pixel electrode and at least a portion of the auxiliary electrode exposed via the auxiliary electrode hole; a spacer corresponding to portions of the auxiliary electrode and the pixel defining layer, the spacer exposing at least a portion of the auxiliary electrode; a light emitting layer on the pixel electrode; and an opposite electrode on the light emitting layer and the spacer, the opposite electrode in contact with the auxiliary electrode.

A contact portion between the opposite electrode and the auxiliary electrode may be surrounded by the spacer in a direction crossing a surface of the auxiliary electrode facing the opposite electrode. The spacer may have a first opening exposing at least a portion of the auxiliary electrode, the first opening overlapping the contact portion between the opposite electrode and the auxiliary electrode.

The pixel defining layer may have a second opening exposing at least a portion of the pixel electrode and a third opening exposing at least a portion of the auxiliary electrode, the third opening overlapping the first opening. The first opening ma have a diameter greater than a diameter of the third opening, and the spacer may form a step with the pixel defining layer at a portion adjacent to the first and third openings.

The display device may include a first intermediate layer on at least a portion of a top surface of the pixel defining layer, a top surface of the spacer, the pixel electrode, and the auxiliary electrode, wherein the first intermediate layer includes a first hole exposing at least a portion of the auxiliary electrode so that the opposite electrode contacts the auxiliary electrode via the first hole. The first hole may expose only a portion of the auxiliary electrode.

The display device may include a second intermediate layer between the first intermediate layer and the opposite electrode, the second intermediate layer having a second hole corresponding to the first hole so that the opposite electrode contacts the auxiliary electrode via the first hole and the second hole. The pixel electrode and the auxiliary electrode may include a same material.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
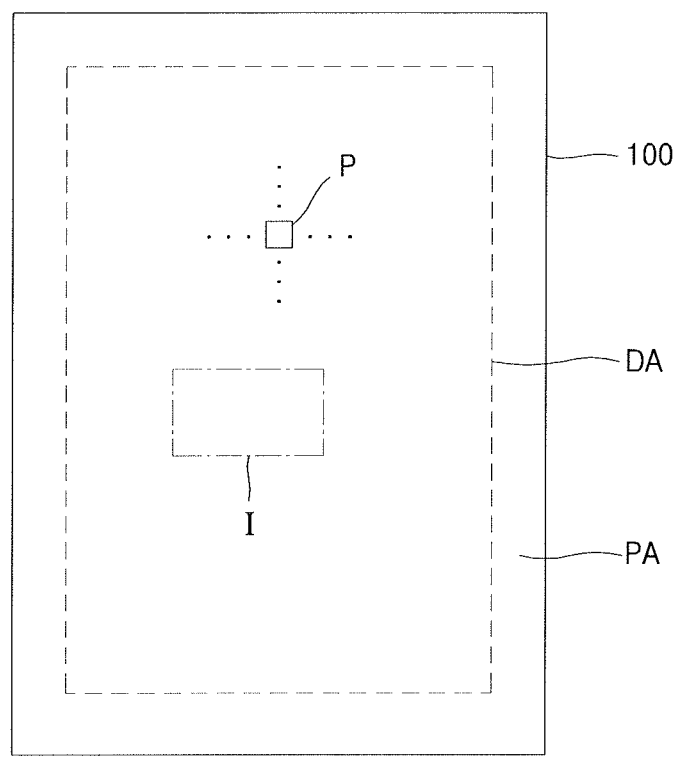
FIG. 1 illustrates an embodiment of an organic light emitting display.
Figure 1:
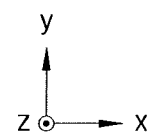

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of an organic light emitting display device which may include a display area DA and a peripheral area PA, that is a non-display area. The display device includes pixels P arranged in the display area DA. The pixels include display elements such as organic light-emitting diodes (OLEDs) that emit light to generate an image. The peripheral area PA may be an area which does not provide an image and may surround the display area DA. A scan driver, a data driver, and power lines (providing power such as a driving voltage and a common voltage) may be in the peripheral area PA. The scan driver and the data driver may provide electrical signals to the pixels P in the display area DA.

Figure 2:
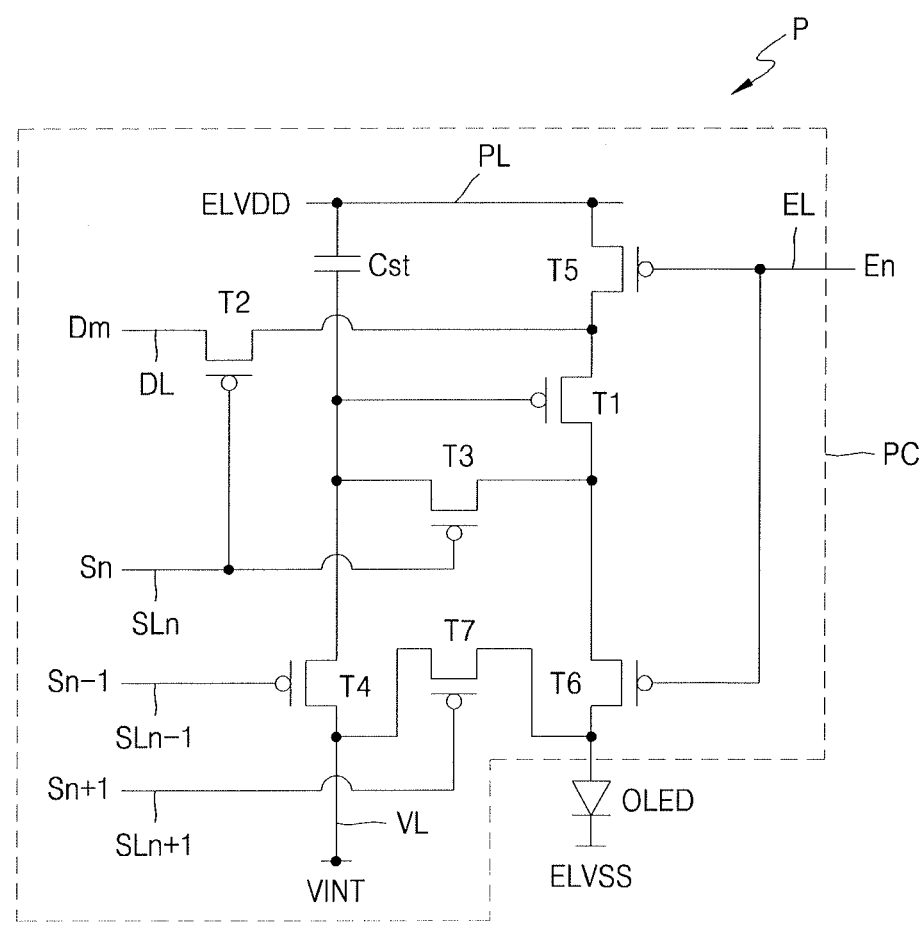
FIG. 2 illustrates an embodiment of a pixel.

FIG. 2 illustrates an embodiment of an equivalent circuit diagram of a pixel, which may be representative of the pixels P in the organic light emitting display device of FIG. 1.

Referring to FIG. 2, the pixel P may include a pixel circuit PC connected to scan lines SLn, SLn−1, and SLn+1, and a data line DL, and include an organic light emitting diode (OLED) connected to the pixel circuit PC. The pixel circuit PC may include a driving thin film transistor (TFT) T1, a switching TFT 2, a compensating TFT T3, a first initializing TFT T4, a first light emitting control TFT T5, a second light emitting control TFT T6, and a second initializing TFT T7.

The driving TFT T1 has a drain electrode electrically connected to the OLED via the second light emitting control TFT T6. The driving TFT T1 may receive a data signal Dm in accordance with a switching operation of the switching TFT T2 and supply a driving current to the OLED.

The switching TFT T2 has a gate electrode connected to the first scan line SLn and a source electrode of the switching TFT T2 connected to the data line DL. The drain electrode of the switching TFT T2 may be connected to a driving voltage line PL via the first light emitting control TFT T5, while being connected to the source electrode of the driving TFT T1.

The switching TFT T2 may be turned on based on the first scan signal Sn received via the first scan line SLn and may execute a switching operation of transferring the data signal Dm from the data line DL to the source electrode of the driving TFT T1.

The compensating TFT T3 has a gate electrode connected to the first scan line SLn, and a source electrode connected to the drain electrode of the driving TFT T1 and further connected to a pixel electrode of the OLED via the second emitting control TFT T6. A drain electrode of the compensating TFT T3 may be connected to any electrode of a storage capacitor Cst, a source electrode of the first initializing TFT 14, and the gate electrode of the driving TFT T1. The compensating TFT T3 may be turned on based on the first scan signal Sn from the first scan line SLn. Thus, the driving TFT T1 may form a diode-connection due to connection of the gate electrode and the drain electrode of the driving TFT T1 to each other.

The first initializing TFT T4 has a gate electrode connected to the second scan line SLn−1, a drain electrode connected to an initializing voltage line VL, and a source electrode connected to one of the electrodes of the storage capacitor Cst, the drain electrode of the compensating TFT T3, or the gate electrode of the driving TFT T1. The first initializing TFT T4 may be turned on based on the second scan signal Sn−1 from the second scan line SLn−1 and may execute an initialization operation of initializing a voltage of the gate electrode of the driving TFT T1 by transferring an initializing voltage VINT to the gate electrode of the driving TFT T1.

The first light emitting control TFT 15 has a gate electrode connected to the light emitting control line EL, a source electrode connected to the driving voltage line PL, and a drain electrode connected to the source electrode of the driving TFT T1 and the drain electrode of the switching TFT T2.

The second light emitting control TFT T6 has a gate electrode connected to the light emitting control line EL, a source electrode connected to the drain electrode of the driving TFT T1 and the source electrode of the compensating TFT 13, and a drain electrode electrically connected to the pixel electrode of the OLED. The first light emitting control TFT 15 and the second light emitting control TFT T6 may be simultaneously turned on based on the light emitting control signal En from the light emitting control line EL, in order to transfer a driving voltage ELVDD to the OLED. As a result, driving current flows through the OLED.

The second initializing TFT 17 has a gate electrode connected to the third scan line SLn+1m, source electrode connected to the pixel electrode of the OLED, and a drain electrode connected to the initializing voltage line VL. The second initializing TFT T7 may be turned on based on the third scan signal Sn+1 from the third scan line SLn+1 to initialize the pixel electrode of the OLED.

Another electrode of the storage capacitor Cst may be connected to the driving voltage line PL. Any electrode of the storage capacitor Cst may be simultaneously connected to the gate electrode of the driving TFT T1, the drain electrode of the compensating TFT T3, and the source electrode of the first initializing TFT T4.

An opposite electrode of the OLED may receive a common power voltage ELVSS. The OLED may emit light by receiving the driving current from the driving TFT T1.

The pixel circuit PC may have a different number of TFTs and/or the capacitors in another embodiment. For example, the pixel circuit PC may include the driving and switching TFTs T1 and T2, the storage capacitor Cst, and other TFTs and storage capacitors.

FIG. 2 illustrates case in which the signal lines SLn, SLn−1, SLn+1, EL, and DL are in the pixel P. In another embodiment, at least one of the signal lines SLn, SLn−1, SLn+1, EL, and DL, and/or an initializing voltage line VL may be shared by neighboring pixels. Also, FIG. 2 illustrates a case in which the first initializing TFT T4 and the second initializing TFT T7 are connected to the second scan line SLn−1 and the third scan line SLn+1, respectively. However, the first initializing TFT T4 and the second initializing TFT T7 may be connected to the second scan line SLn−1.

Figure 3:
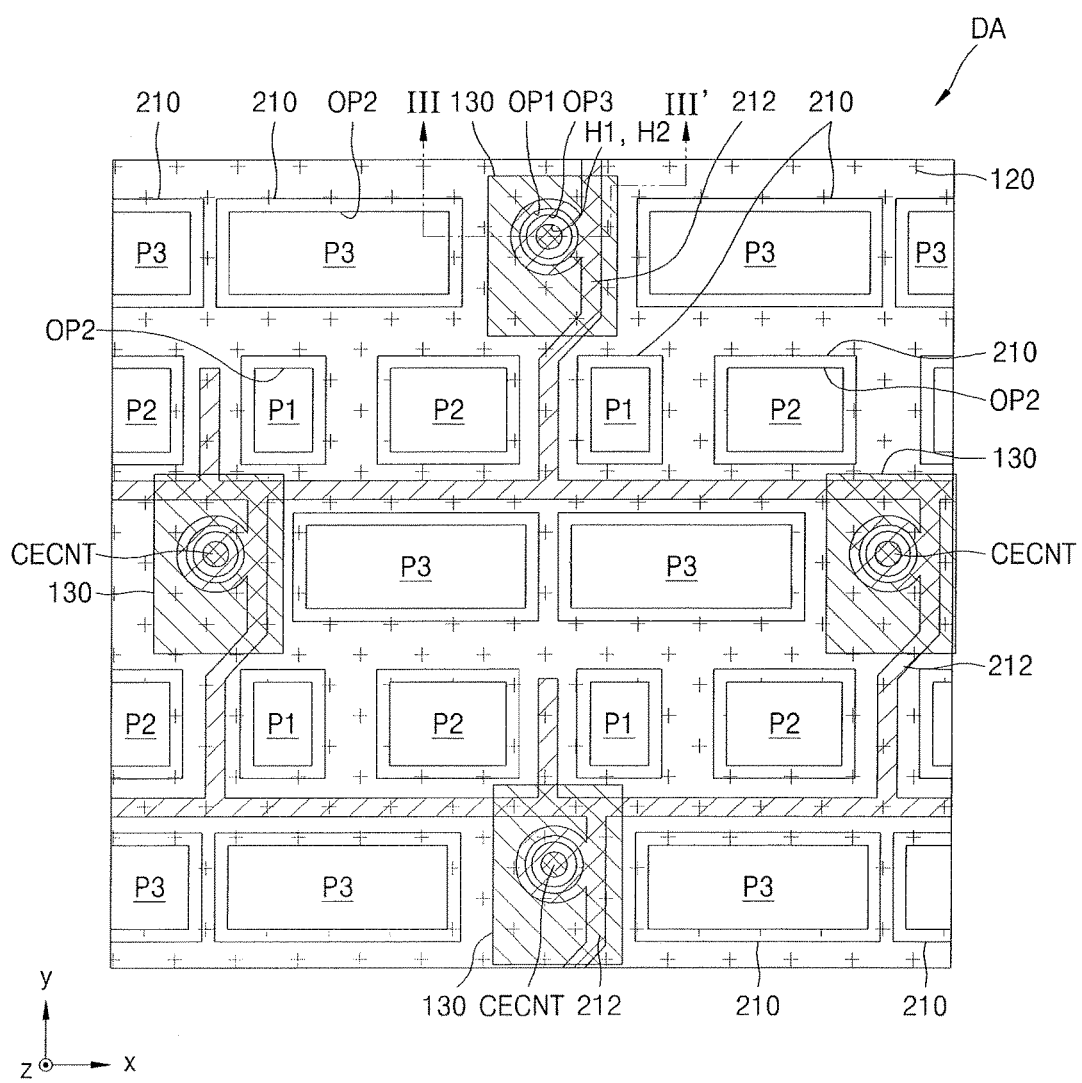
FIG. 3 illustrates an embodiment of portion I in FIG. 1.
Figure 4:
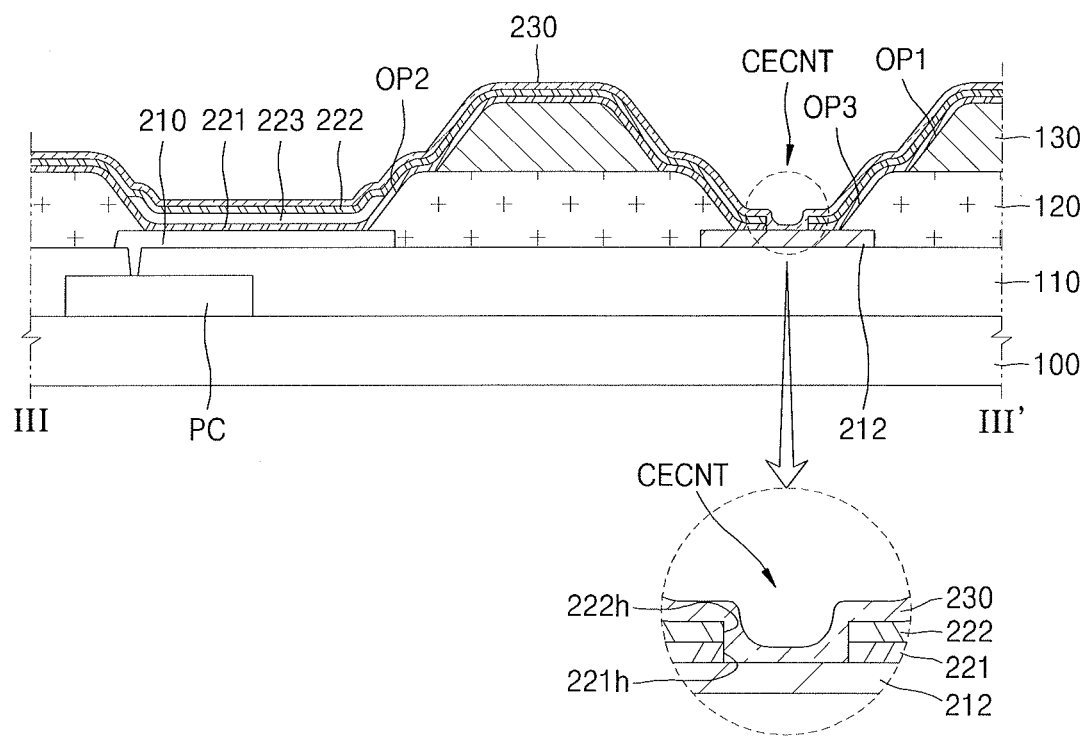
FIG. 4 illustrates an embodiment taken along section line III-III' of FIG. 3.
Figure 5A:
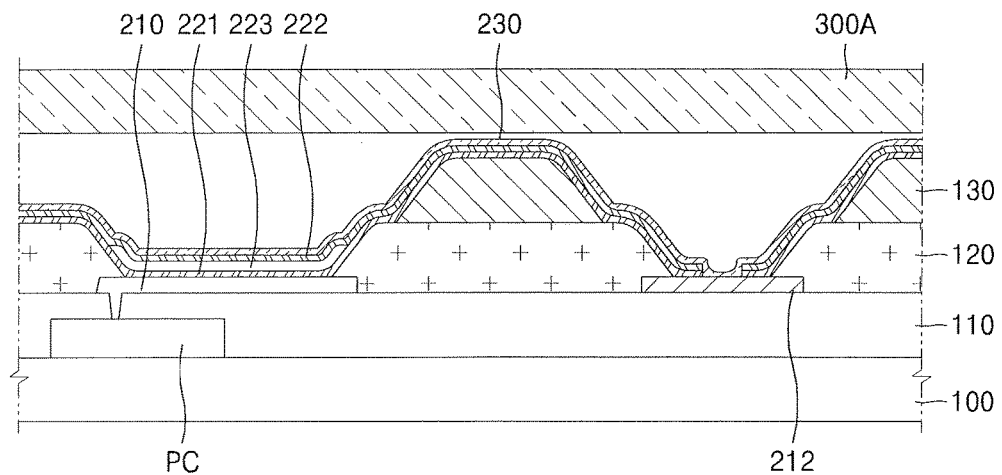
FIGS. 5A and 5B illustrate embodiments including sealing members.
Figure 5B:
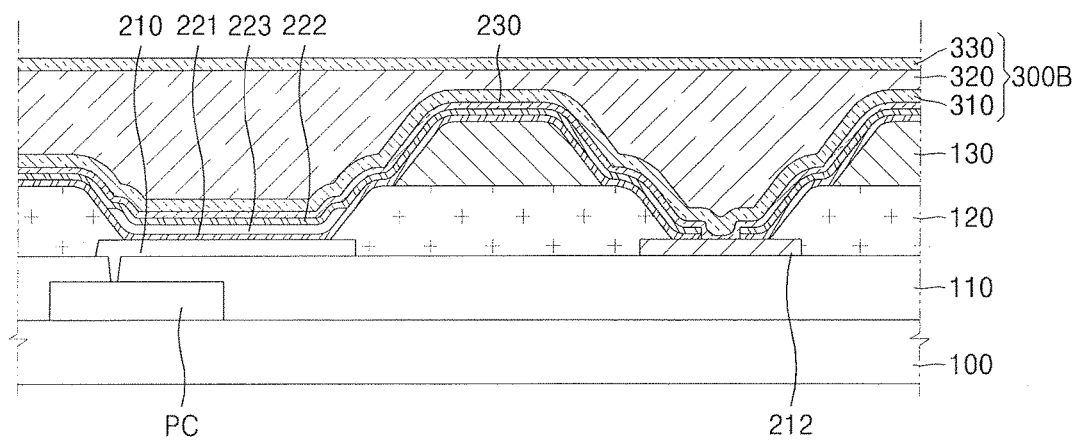

FIG. 3 illustrates a plan view of an embodiment of part of a portion I in FIG. 1. FIG. 4 illustrates an embodiment of a cross-sectional view of taken along line III-III' in FIG. 3. FIGS. 5A and 5B are cross-sectional views of embodiments including sealing members further formed on an opposite electrode 230 in FIG. 4.

Referring to FIG. 3, a first pixel P1, a second pixel P2, and a third pixel P3 may be arranged in the display area DA. Pixel electrodes 210 may correspond to the first through third pixels P1 to P3, respectively, and may be spaced apart from each other. The pixel electrode 210 corresponding to the first pixel P1, the pixel electrode 210 corresponding to the second pixel P2, and the pixel electrode 210 corresponding to the third pixel P3 may have different sizes as illustrated in FIG. 3. In one embodiment, the pixel electrodes 210 may have the same size. In an embodiment, the first pixel P1 may correspond to a red color pixel, the second pixel P2 may correspond to a green color pixel, and the third pixel P3 may correspond to a blue color pixel.

An auxiliary electrode 212 may be in an area where the first to third pixels P1 to P3 are not in the display area DA (non-pixel area). The auxiliary electrode 212 may have, for example, a net structure (or meshed structure). The auxiliary electrode 212 may form an opposite electrode contact unit CECNT by making contact with the opposite electrode 230, which is integrally formed to cover the display area DA (e.g., refer to FIG. 4). The opposite electrode contact unit CECNT may represent a portion where, for example, the opposite electrode 230 and the auxiliary electrode 212 are in a direct contact with each other.

The pixel electrode 210 and the auxiliary electrode 212 may be covered by a pixel defining layer 120. For example, the pixel defining layer 120 may be in the display area DA and may cover end portions of the pixel electrode 210 and the auxiliary electrode 212. The pixel defining layer 120 may have openings OP2 and OP3 exposing at least a portion of the pixel electrode 210 and at least a portion of the auxiliary electrode 212.

A spacer 130 may be on the pixel defining layer 120 in the non-pixel area of the display area DA and may correspond to a portion of the pixel defining layer 120 and the auxiliary electrode 212. The spacer 130 may have an island shape and a plurality of spacers 130 may be spaced apart from each other. In accordance with at least one embodiment, the term "to correspond" when used in connection with these features may mean "to overlap."

The spacer 130 may include an opening OP1 overlapping the opposite electrode contact unit CECNT. In a plan view, the opposite electrode contact unit CECNT may have a shape surrounded by the spacer 130. The opposite electrode 230 may be on the spacer 130 and form the opposite electrode contact unit CECNT by contacting the at least a portion of the auxiliary electrode 212 via the first opening OP1. A structure thereof will be described with reference to FIG. 4. For illustrative purposes, an opening of the spacer 130 may be referred to as first opening OP1, an opening for exposing the pixel electrode 210 of the pixel defining layer 120 may be referred to as second opening OP2, and an opening exposing the auxiliary electrode 212 of the pixel defining layer 120 may be referred to as third opening OP3.

Referring to FIG. 4, the pixel circuit PC may be on a substrate 100 and the pixel circuit PC may be covered by a planarization insulating layer 110. The pixel circuit PC may include at least the driving TFT T1, the switching TFT T2, and the storage capacitor Cst, and may be electrically connected to the pixel electrode 210. The substrate 100 may include a glass or plastic material. The plastic material may include, for example, polyethylene terephthalate (PET), polyethylenenaphthalate (PEN), and/or polyimide (PI). When the substrate 100 includes plastic material, the flexibility thereof may be improved compared to when the substrate 100 includes glass material.

The pixel electrode 210 and the auxiliary electrode 212 may be on the planarization insulating layer 110. For example, a surface of the pixel electrode 210 facing the substrate 100 and a surface of the auxiliary electrode 212 facing the substrate 100 may contact a top surface of planarization insulating layer 110. The planarization insulating layer 110 may include an organic insulating material. Examples of organic insulating materials include imide polymers, general purpose polymers such as polymethylmethacrylate (PMMA) and polystyrene (PS), polymer derivatives having a phenolic group, acrylic polymers, arylether polymers, amide polymers, fluorine polymers, p-xylene polymers, vinyl alcohol polymers, and blends thereof.

The pixel electrode 210 may be a reflective electrode. For example, the pixel electrode 210 may include an electrode layer and/or transparent or semi-transparent electrode layer including at least one of Ag, Mg, Al, Pt, Pd, Au, Ni, Ir, Cr, or a compound thereof. The transparent or semi-transparent electrode layer may include at least one of indium tin oxide (ITO), indium zinc oxide (IZO), zinc oxide (ZnO), indium oxide ($In_2O_3$), indium gallium oxide Indium gallium oxide, or aluminum zinc oxide (AZO). The auxiliary electrode 212 may include the same material as the pixel electrode 210.

The pixel defining layer 120 may be on the pixel electrode 210 and the auxiliary electrode 212. The pixel defining layer 120 may have the second opening OP2 exposing at least a portion of the pixel electrode 210 and the third opening OP3 exposing at least a portion of the auxiliary electrode 212.

The pixel defining layer 120 may define the pixel P via the second opening OP2, which exposes at least a portion of the pixel electrode 210. In addition, the pixel defining layer 120 may increase the distance between an edge of the pixel electrode 210 and the opposite electrode 230, thereby preventing generation of an arc therebetween. The pixel defining layer 120 may include the organic insulating material, e.g., polyimide (PI) and/or hexamethyldisiloxane (HMDSO).

A light emitting layer 223 may be on the pixel electrode 210, which is exposed via the second opening OP2 of the pixel defining layer 120. The light emitting layer 223 may include an organic material including a fluorescent material or a phosphorescent material which emits the red color light, the green color light, or the blue color light. The light emitting layer 223 may include, for example, a low molecular organic material or a polymer organic material.

A first intermediate layer 221 and a second intermediate layer 222 may be beneath and on the light emitting layer 223, respectively. The first intermediate layer 221 may have a single layer or a multi-layer structure. When the first intermediate layer 221 includes the polymeric material, the first intermediate layer 221 may be a hole transport layer (HTL) having the single layer structure and include poly-(3,4)-ethylene-dihydroxythiophene (PEDOT) or polyaniline (PANI). When the first intermediate layer 221 includes a low molecular material, the first intermediate layer 221 may include a hole injection layer (HIL) and the HTL. The second intermediate layer 222 may have a single layer or a multi-layer structure. The second intermediate layer 222 may include an electron transport layer (ETL) and/or an electron injection layer (EIL).

The opposite electrode 230 is on the light emitting layer 223. The opposite electrode 230 may be in contact with an electrode power supply line, outside the display area DA (e.g., in the peripheral area PA of FIG. 1), and may receive the common voltage ELVSS.

The opposite electrode 230 may be the (semi-) transparent electrode. The opposite electrode 230 may be formed as the (semi-)transparent electrode by forming a metal layer including, for example, Li, Ca, LiF/Ca, LiF/Al, Al, Mg, or Ag/Mg, and/or a layer including the (semi-) transparent material such as ITO, IZO, ZnO, or $In_2O_3$. In a non-limiting embodiment, the opposite electrode 230 may be a metal thin film layer containing Ag more than Mg.

The spacer 130 may be on the pixel defining layer 120. For example, the spacer 130 may be directly on and partially in contact with a portion of a top surface of the pixel defining layer 120. The spacer 130 may form a step with the pixel defining layer 120. For example, an edge of the spacer 130 may be stepped with a portion of the top surface of the pixel defining layer 120. The spacer 130 may include the same material as the pixel defining layer 120. For example, the spacer 130 may include the organic insulating material, e.g., PI or HMDSO.

As illustrated in FIG. 5A, when a sealing member of the organic light emitting display device is the encapsulating substrate 300A including the glass material, the spacer 130 may maintain a constant gap between the substrate 100 and the encapsulating substrate 300A, and also may prevent or reduce the Newton ring phenomenon due to sagging of the encapsulating substrate 300A. When the organic light emitting display device includes the encapsulating substrate 300A as illustrated in FIG. 5A and/or a thin film encapsulating layer 300B including at least one inorganic layer (310 or 330) and at least one organic layer 320 as illustrated in FIG. 5B, the spacer 130 may support a mask used in a process of the light emitting layer 223. Thus, problems (such as defects in forming the light emitting layer 223 due to sagging of the mask) may be prevented or reduced.

The spacer 130 may be on the pixel defining layer 120 at a location corresponding to the auxiliary electrode 212 and may include the first opening OP1 for the contact of the opposite electrode 230 and the auxiliary electrode 212. The first opening OP1 may overlap the third opening OP3. The auxiliary electrode 212 and the opposite electrode 230 may directly contact each other via the first opening OP1.

As illustrated in FIG. 4, when the first intermediate layer 221 and the second intermediate layer 222 extend to a top surface of the auxiliary electrode 212 through at least a portion of a top surface of the pixel defining layer 120 and a top surface of the spacer 130, the first intermediate layer 221 and the second intermediate layer 222 may include a first hole 221h and a second hole 222h, respectively. The first and second holes 221h and 222h may expose at least a portion of the top surface of the auxiliary electrode 212 which is exposed via the first and third openings OP1 and OP3. Since the first and second holes 221h and 222h are formed via the same process (e.g., laser drilling), centers of the first and second holes 221h and 222h may coincide with each other. The opposite electrode 230 may be in contact with the auxiliary electrode 212 via the first and second holes 221h and 222h.

In some embodiments, diameters of the first and second holes 221h and 222h may be less than diameters of the first and third openings OP1 and OP3. The diameter of the first opening OP1 may be greater than the diameter of the third opening OP3. The spacer 130 and the pixel defining layer 120 may be stepped at portions close to the first and third openings OP1 and OP3.

At least a portion of an edge of the opposite electrode 230 may contact the electrode power supply line in the periphery area PA (e.g., refer to FIG. 1). The opposite electrode 230 corresponding to the display area DA may locally contact the auxiliary electrode 212. Since the auxiliary electrode 212 is connected to the electrode power supply line and the opposite electrode 230 contacts the auxiliary electrode 212 in the display area DA, an IR drop (or a voltage drop) at the opposite electrode 230 may be prevented or reduced. Thus, it may be possible to prevent an unintentional luminance deviation from occurring or to reduce the luminance deviation even if it occurs.

In addition, since the spacer 130 is arranged to correspond to the opposite electrode contact unit CECNT, contact area and/or the number of the spacer 130 and the opposite electrode contact unit CECNT per unit area of the display area DA may be sufficiently secured. Since the non-pixel area in the display area DA is very small, when the non-pixel area is formed such that the spacer 130 corresponds to the opposite electrode contact unit CECNT according to one embodiment, it may be possible to prevent display quality problems due to suppression of the encapsulating substrate 300A, an abnormal formation of the light emitting layer 223, and the IR drop at the opposite electrode 230, which may occur when the non-pixel area is not formed as presented above. Even though the organic light emitting display device has a high resolution and a medium to large area, and thus has a further reduced non-pixel area, problems of display quality described above may be prevented because the organic light emitting display device includes the above-described structure.

Figure 6A:
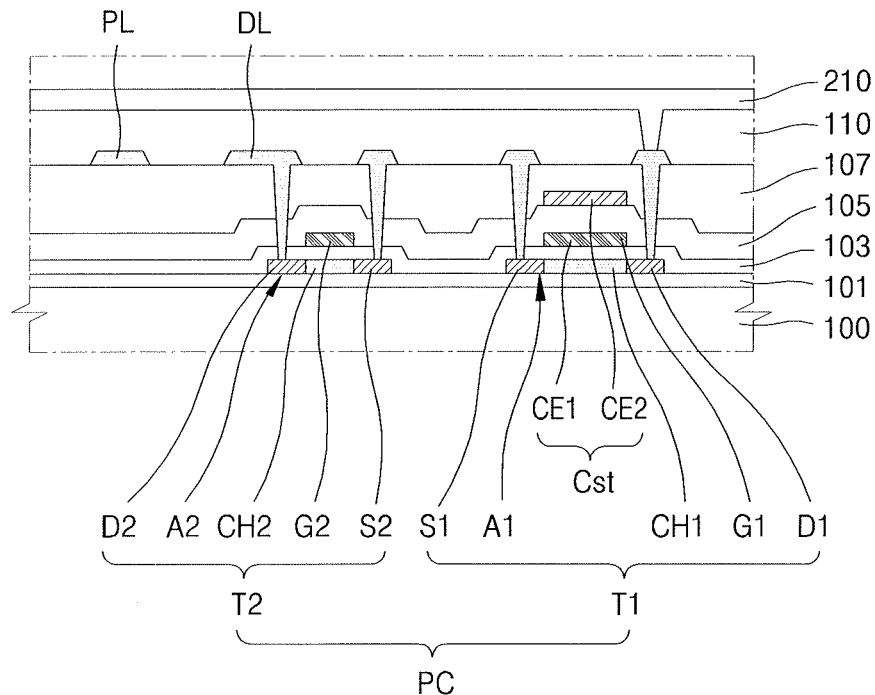
FIGS. 6A to 6C illustrate embodiments of parts of FIG. 4.
Figure 6B:
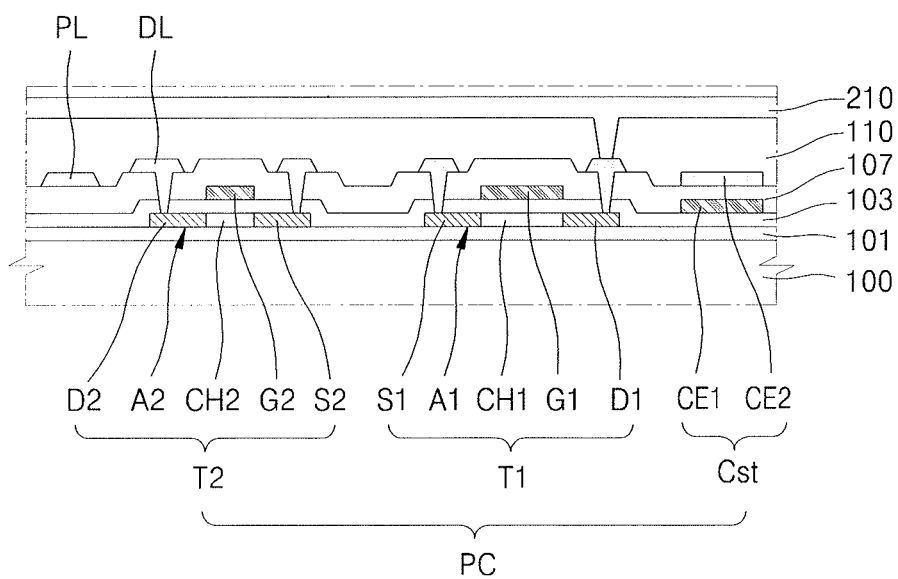
Figure 6C:
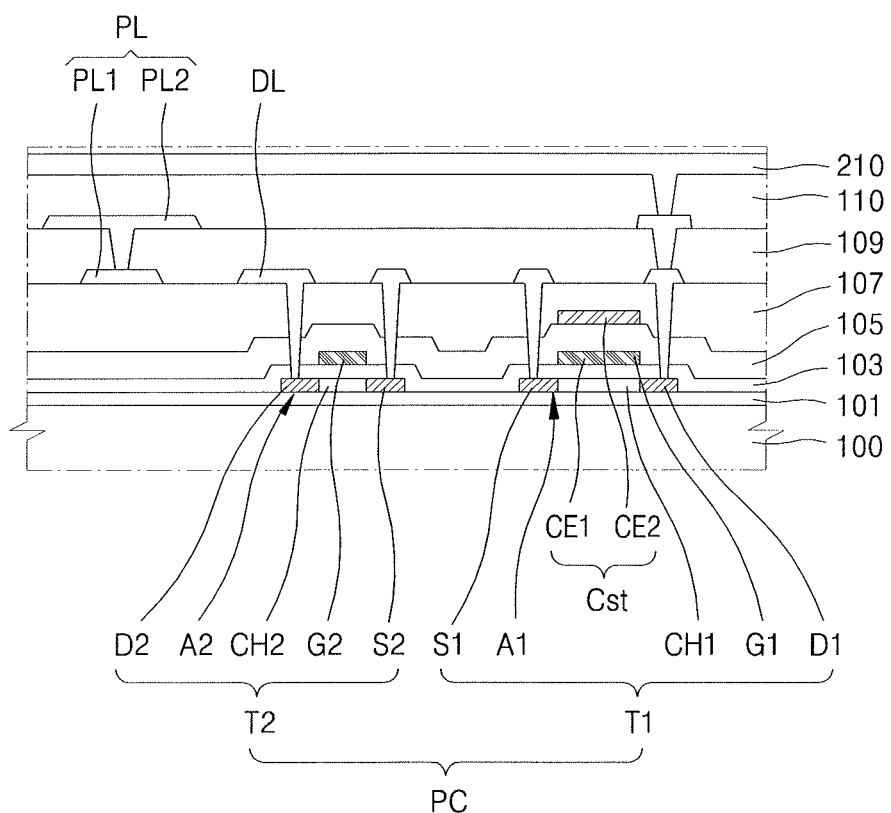

FIGS. 6A to 6C illustrates embodiments of cross-sectional views of parts of the pixel circuit PC of FIG. 4. Referring to FIG. 6A, the pixel circuit PC may include TFTs (such as the driving and switching TFTs T1 and T2) and the storage capacitor Cst. The driving TFT T1 may include a driving channel region CH1, a driving semiconductor layer A1 including a driving source region S1 and a driving drain region D1 on sides of the driving channel region CH1, and a driving gate electrode G1 overlapping the channel region CH1. The driving source region S1 and the driving drain region D1 may be a driving source electrode and a driving drain electrode, respectively.

The switching TFT T2 may include a switching channel region CH2, a switching semiconductor layer A2 including a switching source region S2 and a switching drain region D2 on sides of the switching channel region CH2, and a switching gate electrode G2 overlapping the switching channel region CH2. The switching source region S2 and the switching drain region D2 may be a switching source electrode and a switching drain electrode, respectively.

The storage capacitor Cst may include a first storage capacitor plate CE1 overlapping a second storage capacitor plate CE2. The driving gate electrode G1 of the driving TFT T1 may be the first storage capacitor plate CE1 of storage capacitor Cst.

A buffer layer 101 may be between the substrate 100 and the driving and switching semiconductor layers A1 and A2. A gate insulating layer 103 may be between the driving and switching semiconductor layers A1 and A2 and the driving and switching gate electrodes G1 and G2. A first interlayer insulating layer 105 may be between the first storage capacitor CE1 and the second storage capacitor CE2. A second interlayer insulating layer 107 may be between the storage capacitor Cst and the data line DL and between the storage capacitor Cst and the driving voltage line PL. The planarization insulating layer 110 may be between the data line DL and the pixel electrode 210 and between the driving voltage line PL and the pixel electrode 210.

The buffer layer 101 and the gate insulating layer 103 may have a single layer or a multi-layer including an inorganic material, e.g., silicon nitride (SiNx) and/or silicon oxide (SiOx). The first interlayer insulating layer 105 may be a single layer or a multi-layer including an inorganic material, e.g., SiOx, SiNx, or aluminum oxide ($Al_2O_3$). The second interlayer insulating layer 107 may be a single layer or a multi-layer including an inorganic material, e.g., silicon oxynitride (SiON), SiOx, and/or SiNx. The planarization insulating layer 110 may include an organic insulating material. Examples of organic insulating materials include imide polymers, general purpose polymers (such as PMMA and PS), polymer derivatives having a phenolic group, acrylic polymers, arylether polymers, amide polymers, fluorine polymers, p-xylene polymers, vinyl alcohol polymers, and blends thereof.

In FIG. 6A, the storage capacitor Cst overlaps the driving TFT T1. In another embodiment, the storage capacitor Cst overlaps the driving TFT T1 may not overlap.

Referring to FIG. 6B, the storage capacitor Cst may not overlap the driving TFT T1. The first storage capacitor plate CE1 may be on the same layer (for example, the gate insulating layer 103) and may include the same material as the driving and switching gate electrodes G1 and G2. The second storage capacitor plate CE2 may be on the same layer (for example, the second interlayer insulating layer 107) and may include the same material as the data line DL and the driving voltage line PL.

In FIG. 6A, the driving voltage line PL and the data line DL are on the same layer, but this may not be the case in another embodiment as illustrated, for example, in FIG. 6B Referring to FIG. 6C, the driving voltage line PL may include a bottom driving voltage line PL1 and a top driving voltage line PL2. The bottom driving voltage line PL1 and the top driving voltage line PL2 may be electrically connected to each other via contact holes in an additional insulating layer 109 therebetween. The additional insulating layer 109 may include an organic insulating material. Examples of organic insulating materials include imide polymers, general purpose polymers such as PMMA and PS, polymer derivatives having a phenolic group, acrylic polymers, arylether polymers, amide polymers, fluorine polymers, p-xylene polymers, vinyl alcohol polymers, and blends thereof.

FIGS. 6A to 6C illustrate embodiments of top-gate-type structures in which driving and switching gate electrodes G1 and G2 of driving and switching TFTs T1 and T2 are on driving and switching semiconductor layers A1 and A2, respectively. The driving and switching gate electrodes G1 and G2 may have a bottom-gate-type under driving and switching semiconductor layers A1 and A2 in one embodiment.

Figure 7:
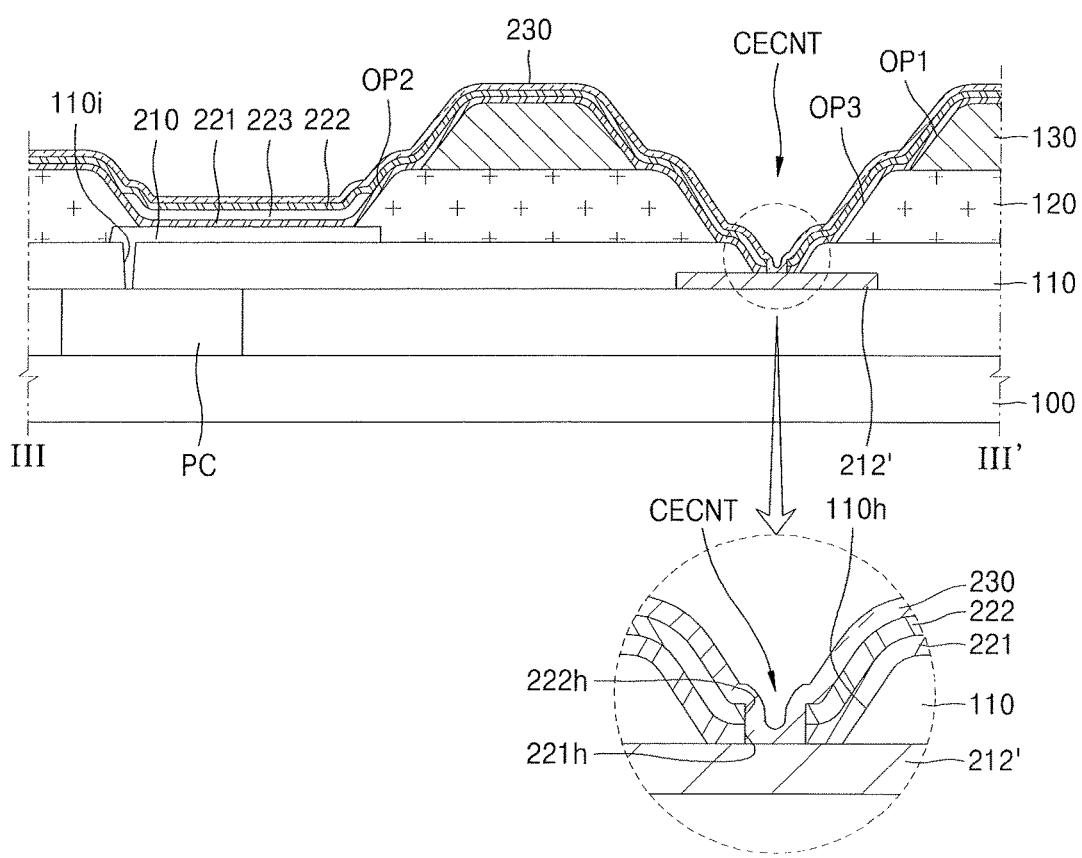
FIG. 7 illustrates another embodiment taken along section line in FIG. 3.

FIG. 7 illustrates a cross-sectional view of another embodiment of an organic light emitting display device. The cross-sectional view in FIG. 7 is taken along the line III-III' in FIG. 3. The other features of the organic light emitting display device of FIG. 7 may be same as the embodiments in FIGS. 3 and 4.

Referring to FIG. 7, the auxiliary electrode 212' may not be on the same layer as the pixel electrode 210. The auxiliary electrode 212' may be below the pixel electrode 210, with the planarization insulating layer 110 therebetween. The planarization insulating layer 110 may include an auxiliary electrode hole 110h exposing the auxiliary electrode 212'.

The auxiliary electrode 212' may include a different material from the pixel electrode 210. In an embodiment, the auxiliary electrode 212' may include the same material as the data line DL and the driving voltage line PL described with reference to FIGS. 6A and 6B. In one embodiment, the auxiliary electrode 212' may include the same material as the driving voltage line PL, e.g., the top driving voltage line PL2 described with reference to FIG. 6C. For example, the auxiliary electrode 212' may include molybdenum (Mo), aluminum (Al), copper (Cu), titanium (Ti), or the like, and may be formed as a single layer or a multi-layer. In a non-limiting embodiment, the auxiliary electrode 212' may include multiple layers of Ti/Al/Ti.

The auxiliary electrode hole 110h of the planarization insulating layer 110 may overlap the first opening OP1 and the third opening OP3 described above with reference to FIG. 4. At least a portion of the top surface of the auxiliary electrode 212' exposed via the auxiliary electrode hole 110h may contact the opposite electrode 230 above the spacer 130 via the first opening OP.

The first and second intermediate layers 221 and 223 may respectively include a first hole 221h and a second hole 223h, which expose at least a portion of the auxiliary electrode 212'. The opposite electrode 230 may be in contact with the auxiliary electrode 212' via the first and second holes 221h and 223h. The structure in which the opposite electrode contact portion CECNT is formed to be surrounded by the spacer 130, while the opposite electrode 230 and the auxiliary electrode 212' are in contact with each other is the same as the structure described with reference to FIG. 3.

Diameters of the first and second holes 221h and 222h may be less than or equal to that of the auxiliary electrode hole 110h. The diameter of the auxiliary electrode hole 110h may be less than or equal to the diameter of the first opening OP1 and less than the diameter of the third opening OP3 as described above.

Figure 8A:
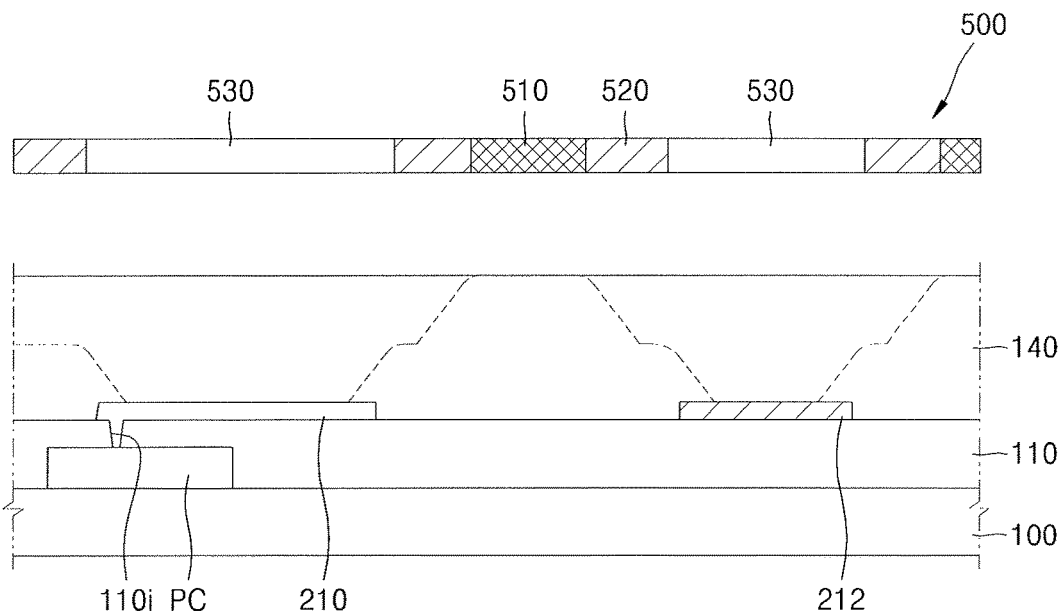
FIGS. 8A to 8D illustrate stages corresponding to an embodiment of processes for manufacturing an organic light emitting display device.

FIGS. 8A to 8D illustrate embodiments of manufacturing processes of an organic light emitting display device. Referring to FIG. 8A, the pixel circuit PC may be formed on the substrate 100, and the planarization insulating layer 110 covering the pixel circuit PC may be formed. The pixel circuit PC may have a structure described, for example, with reference to FIGS. 6A to 6C. The planarization insulating layer 110 may include a pixel circuit hole 110i for electrical connection with pixel electrode 210.

Subsequently, the pixel electrode 210 and the auxiliary electrode 212 may be formed on the planarization insulating layer 110. The pixel electrode 210 and the auxiliary electrode 212 may be formed by forming a conductive material layer and patterning the conductive material layer. The pixel electrode 210 and the auxiliary electrode 212 may include an electrode layer including, for example, materials Ag, Mg, Al, Pt, Pd, Au, Ni, Nd, Ir, Cr, and compounds thereof, and/or a transparent or (semi-) transparent electrode layer including indium tin oxide (ITO). In a non-limiting embodiment, the pixel electrode 210 and the auxiliary electrode 212 may be multi-layers of ITO/Ag/ITO.

Next, an organic insulating material layer 140 may be formed on the pixel electrode 210 and the auxiliary electrode 212, and may be exposed using, for example, a halftone mask 500. The halftone mask 500 may include a light shielding portion 510, a semi-transmission portion 520, and a transmission portion 530. After the halftone mask 500 is aligned/installed, the organic insulating material layer 140 may be exposed by irradiating light, e.g., ultraviolet rays. The organic insulating material layer 140 may include, for example, an organic insulating material of a positive photo resist. In some embodiments, the organic insulating material layer 140 may include polyimide (PI) based organic materials or may include HMDSO.

Figure 8B:
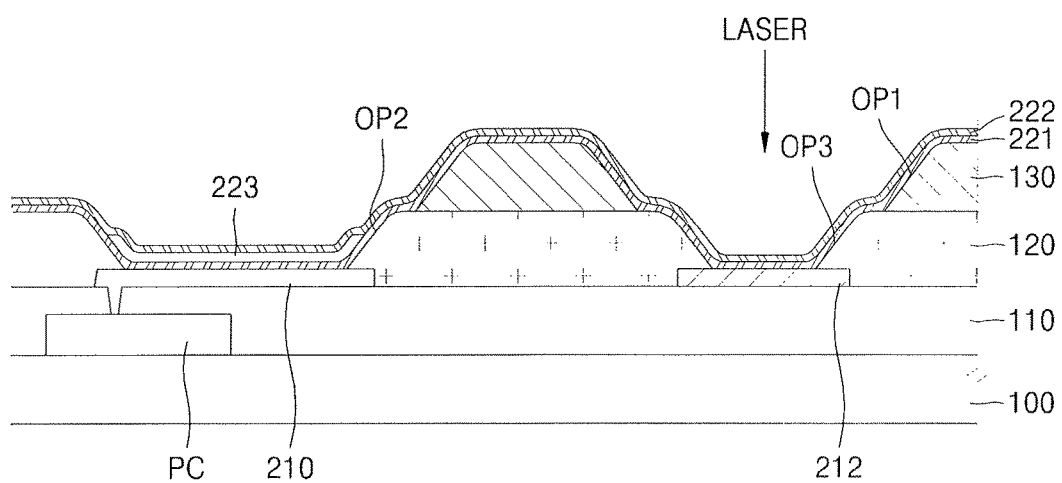

The pixel defining layer 120 and the spacer 130 may be formed via exposure using the halftone mask 500 and developing processes of the organic insulating material layer 140. As illustrated in FIGS. 8A and 8B, all of the organic insulating material layer 140 at a position corresponding to the light transmission portion 530 of the halftone mask 500 may be removed to expose the pixel electrode 210 and the auxiliary electrode 212. As the organic insulating material having a certain depth is removed from the organic insulating material layer 140 in a region corresponding to the semi-transmission portion 520 of the halftone mask 500, the pixel defining layer 120 having a certain thickness may be formed. A spacer 130 may be formed at a location corresponding to the light shielding portion 510.

The transmission portion 530 of the halftone mask 500 may be arranged to correspond, not only to the pixel electrode 210, but also to the auxiliary electrode 212 so that the spacer 130 includes the first opening OP1 penetrating the spacer 130. The pixel defining layer 120 includes the second opening OP2 and the third opening OP3 exposing the pixel electrode 210 and the auxiliary electrode 212, respectively.

In the present embodiment, halftone mask 500 is used. In one embodiment, another type of mask (e.g., a slit mask) may be used instead of the halftone mask 500.

Referring to FIG. 8B, a first intermediate layer 221 may be formed on the substrate 100 over which the pixel defining layer 120 and the spacer 130 are formed. The light emitting layer 223 corresponding to the pixel electrode 210 may be formed on the first intermediate layer 221. The second intermediate layer 222 may be formed on the light emitting layer 223.

The first intermediate layer 221 may be formed to cover the entire display area DA (e.g., refer to FIG. 3) on at least portions of the top surfaces of the pixel electrode 210, the auxiliary electrode 212, and the pixel defining layer 120, and on the top surface of the spacer 130. The first intermediate layer 221 may include the HTL and/or the HIL.

The light emitting layer 223 may be formed on the first intermediate layer 221 to correspond to the pixel electrode 210. The light emitting layer 223 may include a low molecular organic material or a polymer organic material. The light emitting layer 223 may include a fluorescent material or a phosphorescent material that emits red color light, green color light, or blue color light.

The second intermediate layer 222 may be formed on the light emitting layer 223 to cover the entire display area DA (e.g., refer to FIG. 3). The second intermediate layer 222 may include the ETL and/or the EIL. In the present embodiment, both the first intermediate layer 221 and the second intermediate layer 222 are formed. In one embodiment, the second intermediate layer 222 may be omitted. The case in which the first and second intermediate layers 221 and 222 are formed will be described below.

Figure 8C:
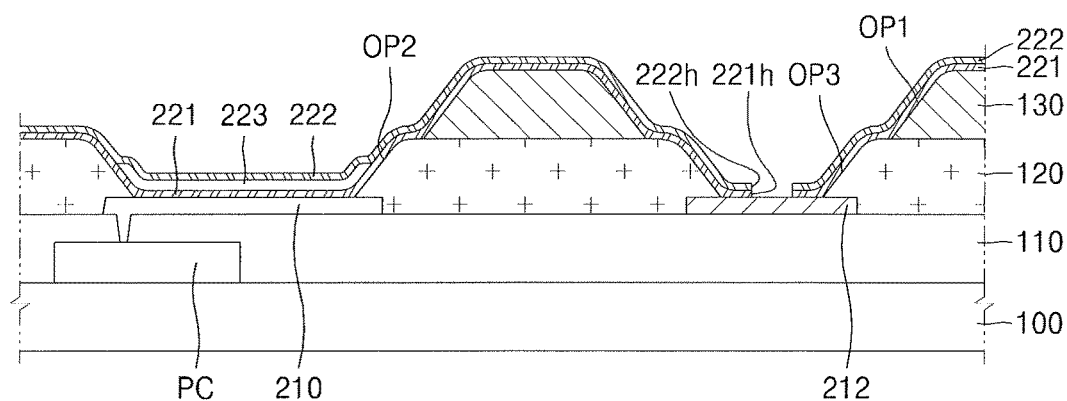

Next, referring to FIG. 8C, the first hole 221h of the first intermediate layer 221 and the second hole 222h of the second intermediate layer 222 may be formed by removing portions of the first and second intermediate layers 221 and 222 corresponding to the auxiliary electrode 212. As illustrated in FIG. 8B, a laser beam may be irradiated onto the second intermediate layer 222 corresponding to at least a portion of the auxiliary electrode 212, and the first hole 221h of the first intermediate layer 221 and the second hole 222h of the second intermediate layer 222 may be simultaneously formed. The laser beam may be irradiated onto the second intermediate layer 222 through the first and third openings OP1 and OP3. Since the first and second holes 221h and 222h are formed by the same laser beam, centers of the first and second holes 221h and 222h may coincide with each other. Radii of the first and second holes 221h and 222h may be different from each other due to the material of the first and second intermediate layers 221 and 222, and a difference in the order in which they are exposed to the laser beam.

Figure 8D:
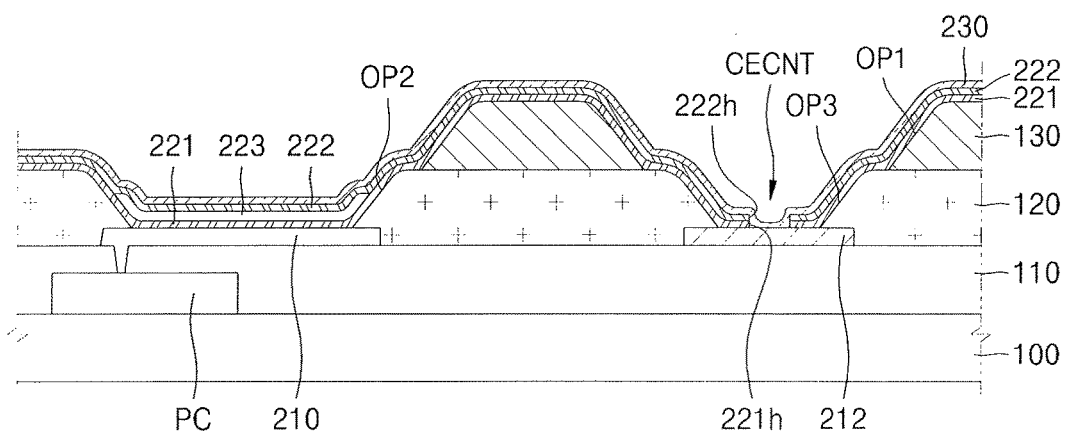

Referring to FIG. 8D, the opposite electrode 230 may be formed. The opposite electrode 230 may be integrally formed to cover at least the display area DA (e.g., refer to FIG. 3). The opposite electrode 230 may be formed on the second intermediate layer 222 to correspond to at least portions of the light emitting layer 223, the auxiliary electrode 212, and the pixel defining layer 120, and the spacer 130. The opposite electrode 230 over the spacer 130 and may contact the top surface of the auxiliary electrode 212 via the first opening OP1 of the spacer 130. In this case, the auxiliary electrode 212 may be exposed via the first and second holes 221h and 222h of the first and second intermediate layers 221 and 222, respectively, which are formed, for example, by the laser drilling process described above.

By arranging the spacer 130 to correspond to contact portions of the opposite electrode 230 and the auxiliary electrode 212 (e.g., the opposite electrode contact portion CECNT via the above-described process), distribution densities per unit area of the opposite electrode contact portion CECNT and the spacer 130 may be sufficiently secured or increased.

By forming the spacer 130 and the pixel defining layer 120 in the same mask process via the above-described process, process time and cost may be reduced. Problems may be prevented such as misalignment between the spacer 130 and the opposite electrode contact CECNT. Also, subsequent contact deficiency between the opposite electrode 230 and the auxiliary electrode 212, which may occur when forming the spacer 130 and the pixel defining layer 120 is executed in a separate process, may be prevented.

Figure 9A:
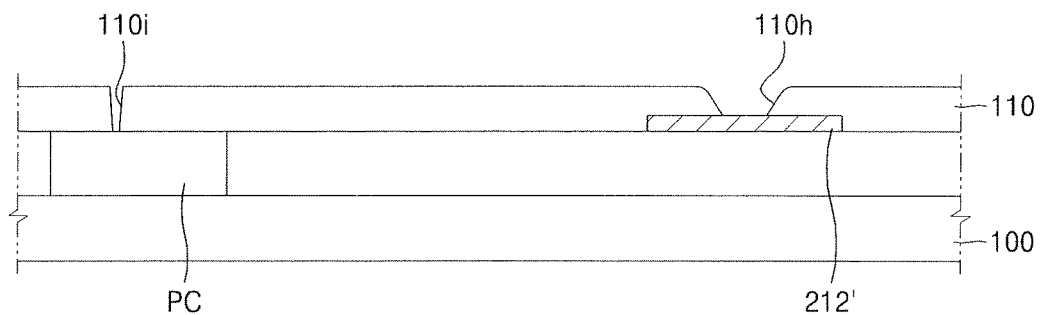
FIGS. 9A to 9E illustrate stages corresponding to another embodiment of processes for manufacturing an organic light emitting display device.

FIGS. 9A to 9E are cross-sectional views illustrating additional embodiments of processes for manufacturing an organic light emitting display device. Referring to FIG. 9A, the pixel circuit PC may be formed on the substrate 100 and the planarization insulating layer 110 may be formed. The pixel circuit PC may have a structure as described, for example, with reference to FIGS. 6A to 6C. The auxiliary electrode 212' may be formed together with the driving voltage line PL in the process of forming the driving voltage line PL in FIGS. 6A and 6B, or may be formed together with the top driving voltage line PL2 in the process of forming the top driving voltage line PL2 in FIG. 6C. The auxiliary electrode 212' may include, for example, Mo, Al, Cu, Ti, or another material and may be formed as a single layer or a multi-layer. In a non-limiting embodiment, the auxiliary electrode 212' may include multiple layers of Ti/Al/Ti.

After the auxiliary electrode 212' is formed, the planarization insulating layer 110 covering the auxiliary electrode 212' may be formed. The planarization insulating layer 110 may include a pixel circuit hole 110i exposing the pixel circuit PC and the auxiliary electrode hole 110h exposing the auxiliary electrode 212'.

Figure 9B:
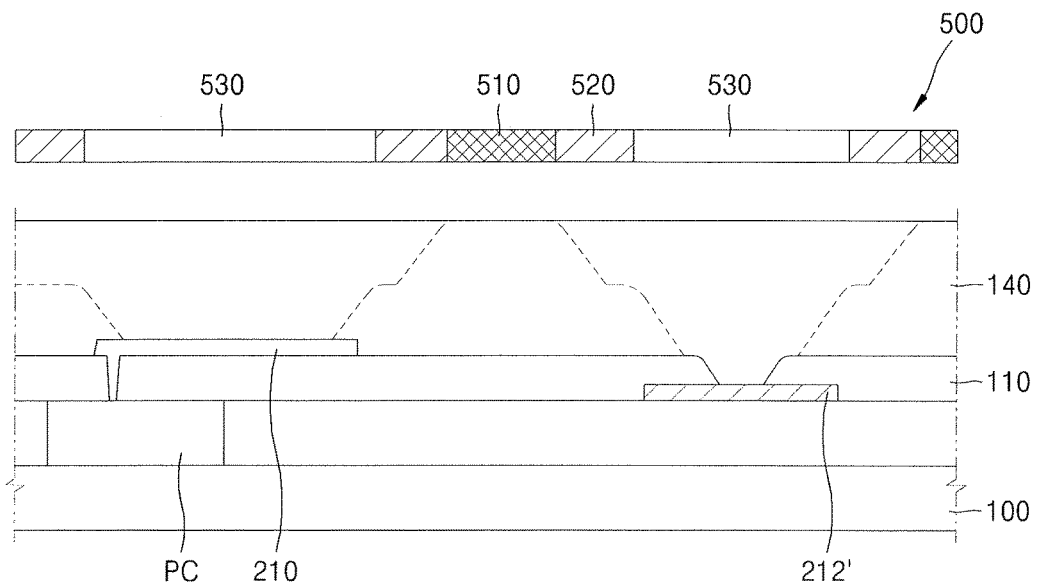

Referring to FIG. 9B, the pixel electrode 210 may be formed on the planarization insulating layer 110 and the organic insulating material layer 140 may be formed on the pixel electrode 210. The organic insulating material layer 140 may include an organic insulating material of a PI group or a positive photo resist including HMDSO, and the like, as described above.

Figure 9C:
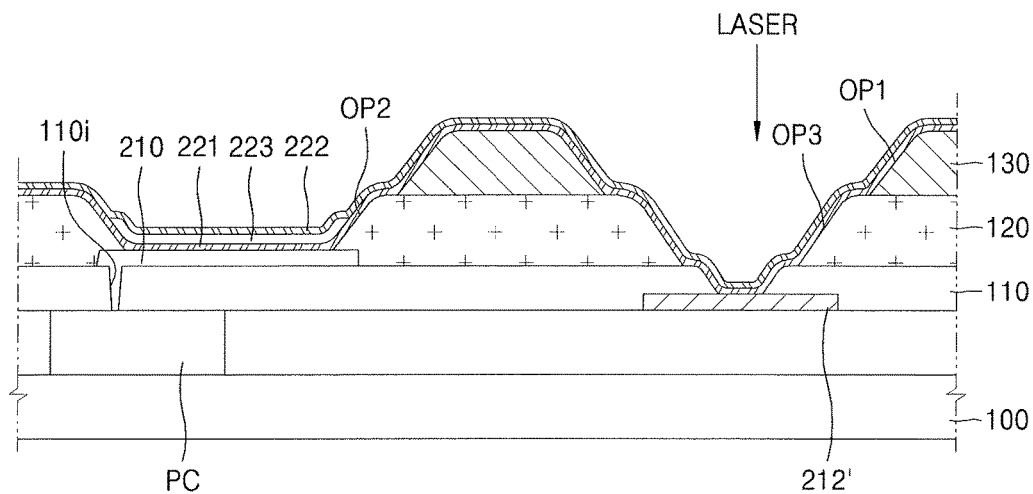

The halftone mask 500 may be aligned/installed on the organic insulating material layer 140. Then, the organic insulating material layer 140 may be exposed to light by irradiating light such as ultraviolet rays and developed to form the pixel defining layer 120 and the spacer 130. The light shielding portion 510 of the halftone mask 500 may be aligned to correspond to a position where the spacer 130 is to be formed. The semi-transmission portion 520 may be at a position where the pixel defining layer 120 is to be formed without overlapping the spacer 130. Since the transmission portion 530 of the halftone mask 500 is aligned to correspond to not only the pixel electrode 210 but also the auxiliary electrode 212'. The spacer 130 may include the first opening OP1 penetrating the spacer 130 as illustrated in FIG. 9C. The pixel defining layer 120 may include the second and third openings OP2 and OP3 respectively exposing the pixel electrode 210 and the auxiliary electrode 212'.

Referring to FIG. 9C, the first intermediate layer 221 may be formed over the substrate 100 over which the pixel defining layer 120 and the spacer 130 are formed, the light emitting layer 223 corresponding to the pixel electrode 210 on the first intermediate layer 221 may be formed, and the second intermediate layer 222 may be formed on the light emitting layer 223. The process of forming the first intermediate layer 221, the light emitting layer 223, and the second intermediate layer 222 may be the same as the process described above with reference to FIG. 8B. However, since the auxiliary electrode 212' is under the planarization insulating layer 110 and exposed via the auxiliary electrode hole 110h according to an embodiment, the first and second intermediate layers 221 and 222 may also be on side walls of the planarization insulating layer 110 adjacent to the auxiliary electrode hole 110h.

Figure 9D:
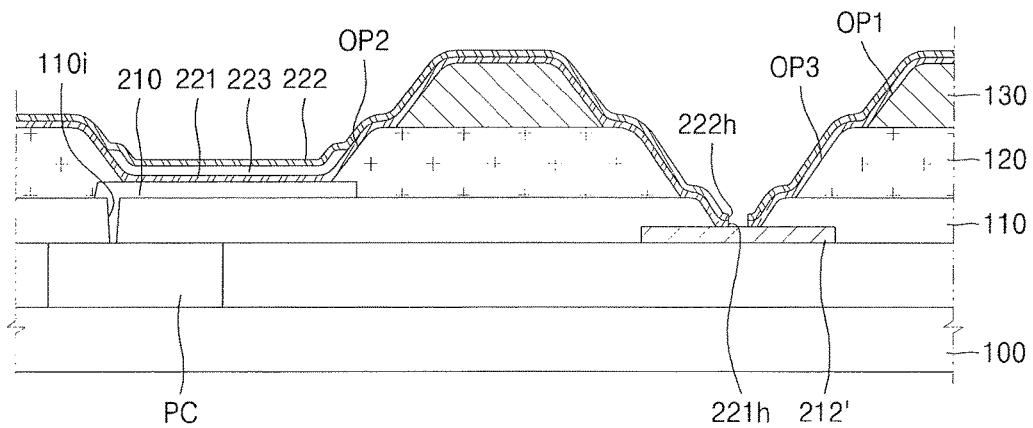

As illustrated in FIGS. 9C and 9D, the laser beam may be irradiated onto the second intermediate layer 222 corresponding to at least a portion of the auxiliary electrode 212', and the first hole 221h of the first intermediate layer 221 and the second hole 222h of the second intermediate layer 222 may be simultaneously formed. Sizes of the first and second holes 221h and 222h may be smaller than or equal to the size of the auxiliary electrode hole 110h.

Figure 9E:
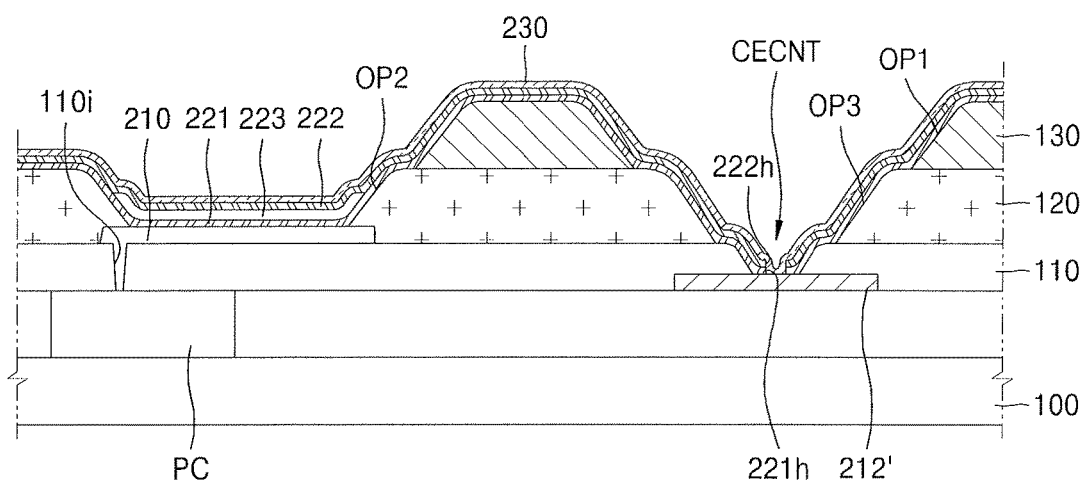

Referring to FIG. 9E, the opposite electrode 230 may be formed. The opposite electrode 230 may be integrally formed to cover at least the display area DA (e.g., refer to FIG. 3). In forming the opposite electrode 230, the opposite electrode 230 may cover the top surface of the spacer 130 and contact the top surface of the auxiliary electrode 212' via the first opening OP1 penetrating the spacer 130. In this case, the auxiliary electrode 212' may be exposed via the first and second holes 221h and 222h of the first and second intermediate layers 221 and 222, respectively, which have been formed by the laser drilling process described above.

By arranging the spacer 130 to correspond to contact portions of the opposite electrode 230 and the auxiliary electrode 212' (e.g., the opposite electrode contact portion CECNT via the above-described process), areas and/or densities per unit area of the opposite electrode contact portion CECNT and the spacer 130 may be sufficiently secured or increased. Accordingly, display quality of an organic light emitting display device may be improved.

In addition, the spacer 130 and the pixel defining layer 120 may be formed in the same mask process to reduce the process time and cost. Thus, problems may be prevented, such as misalignment between the spacer 130 and the opposite electrode contact CECNT, and subsequent contact deficiency between the opposite electrode 230 and the auxiliary electrode 212', which may occur when forming the spacer 130 and the pixel defining layer 120 is executed in a separate process.

In accordance with one or more of the aforementioned embodiments, an organic light emitting diode display may sufficiently secure an area and/or the number of spacers and opposite electrode contacts per unit area, and thus may provide a high quality image.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. An organic light emitting display device, comprising:
   a pixel electrode and an auxiliary electrode on a same layer, the pixel electrode and the auxiliary electrode separated and electrically isolated from each other;
   a pixel defining layer on the pixel electrode and the auxiliary electrode, the pixel defining layer including a first opening exposing a portion of the pixel electrode and a second opening exposing a portion of the auxiliary electrode;
   a spacer on the pixel defining layer so as to correspond to portions of the auxiliary electrode and the pixel defining layer, the spacer including a third opening exposing the portion of the auxiliary electrode and a portion of the spacer surrounding the third opening;
   a light emitting layer on the pixel electrode; and
   an opposite electrode on the light emitting layer and the spacer, the opposite electrode in contact with the auxiliary electrode through the second opening and the third opening by passing through the spacer.

2. The display device as claimed in claim 1, wherein a contact portion between the opposite electrode and the auxiliary electrode is surrounded by the spacer in a direction crossing a surface of the auxiliary electrode facing the opposite electrode.

3. The display device as claimed in claim 1, wherein the third opening overlaps a contact portion between the opposite electrode and the auxiliary electrode.

4. The display device as claimed in claim 1, wherein the third opening has a diameter greater than a diameter of the second opening.

5. The display device as claimed in claim 1, further comprising:
a first intermediate layer on at least a portion of a top surface of the pixel defining layer, a top surface of the spacer, the pixel electrode, and the auxiliary electrode, wherein the first intermediate layer has a first hole exposing at least a portion of the auxiliary electrode so that the opposite electrode contacts the auxiliary electrode via the first hole.

6. The display device as claimed in claim 5, wherein the first hole exposes only a portion of the auxiliary electrode.

7. The display device as claimed in claim 5, further comprising:
a second intermediate layer between the first intermediate layer and the opposite electrode, wherein the second intermediate layer has a second hole corresponding to the first hole so that the opposite electrode contacts the auxiliary electrode via the first hole and the second hole.

8. The display device as claimed in claim 7, wherein the second hole has a center which coincides with a center of the first hole.

9. The display device as claimed in claim 1, wherein the spacer and the pixel defining layer include a same material.

10. The display device as claimed in claim 1, wherein the pixel electrode and the auxiliary electrode include a same material.

11. The display device as claimed in claim 1, wherein the third opening of the spacer is in a middle region of the spacer.

12. The display device as claimed in claim 1, wherein the third opening of the spacer is entirely enclosed by the spacer.

13. An organic light emitting display device, comprising:
an auxiliary electrode;
an insulating layer covering the auxiliary electrode and including an auxiliary electrode hole exposing the auxiliary electrode;
a pixel electrode on the insulating layer and electrically insulated from the auxiliary electrode;
a pixel defining layer on the insulating layer, the pixel defining layer including a first opening exposing a portion of the pixel electrode and a second opening exposing a portion of the auxiliary electrode exposed via the auxiliary electrode hole;
a spacer on the pixel defining layer so as to correspond to portions of the auxiliary electrode and the pixel defining layer, the spacer including a third opening exposing the portion of the auxiliary electrode and a portion of the spacer surrounding the third opening;
a light emitting layer on the pixel electrode; and
an opposite electrode on the light emitting layer and the spacer, the opposite electrode in contact with the auxiliary electrode through the second and third openings by passing through the spacer.

14. The display device as claimed in claim 13, wherein a contact portion between the opposite electrode and the auxiliary electrode is surrounded by the spacer in a direction crossing a surface of the auxiliary electrode facing the opposite electrode.

15. The display device as claimed in claim 14, wherein the third opening overlaps the contact portion between the opposite electrode and the auxiliary electrode.

16. The display device as claimed in claim 13, wherein:
the third opening has a diameter greater than a diameter of the second opening, and
the spacer forms a step with the pixel defining layer at a portion adjacent to the second and third openings.

17. The display device as claimed in claim 13, further comprising:
a first intermediate layer on at least a portion of a top surface of the pixel defining layer, a top surface of the spacer, the pixel electrode, and the auxiliary electrode, wherein the first intermediate layer includes a first hole exposing at least a portion of the auxiliary electrode so that the opposite electrode contacts the auxiliary electrode via the first hole.

18. The display device as claimed in claim 17, wherein the first hole exposes only a portion of the auxiliary electrode.

19. The display device as claimed in claim 17, further comprising:
a second intermediate layer between the first intermediate layer and the opposite electrode, the second intermediate layer having a second hole corresponding to the first hole so that the opposite electrode contacts the auxiliary electrode via the first hole and the second hole.

20. The display device as claimed in claim 13, wherein the pixel electrode and the auxiliary electrode include a same material.

* * * * *